(12) United States Patent
Kot et al.

(10) Patent No.: US 12,704,788 B2
(45) Date of Patent: Aug. 11, 2026

(54) PARALLAX METHOD FOR A SINGLE-CELL DIFFRACTION BASED MEASUREMENT OF MISREGISTRATION

(71) Applicant: KLA Corporation, Milpitas, CA (US)

(72) Inventors: Mordechy Kot, Migdal Haemek (IL); Yuval Lamhot, Haifa (IL)

(73) Assignee: KLA Corporation, Milpitas, CA (US)

( * ) Notice: Subject to any disclaimer, the term of this patent is extended or adjusted under 35 U.S.C. 154(b) by 686 days.

(21) Appl. No.: 18/107,813

(22) Filed: Feb. 9, 2023

(65) Prior Publication Data

US 2023/0259041 A1 Aug. 17, 2023

Related U.S. Application Data

(60) Provisional application No. 63/311,444, filed on Feb. 17, 2022.

(51) Int. Cl.
*G03F 7/00* (2006.01)
*G01B 11/27* (2006.01)

(52) U.S. Cl.
CPC ........ *G03F 7/70633* (2013.01); *G01B 11/272* (2013.01)

(58) Field of Classification Search
CPC ........... G03F 7/70633; G03F 7/706849; G01B 11/272
See application file for complete search history.

(56) References Cited

U.S. PATENT DOCUMENTS

| | | | |
|---|---|---|---|
| 7,317,531 B2 | 1/2008 | Mieher et al. | |
| 10,197,389 B2 | 2/2019 | Levinski et al. | |
| 2018/0216930 A1* | 8/2018 | Ur-Rehman | G01B 11/30 |
| 2018/0217508 A1* | 8/2018 | Urbanczyk | G03F 7/70633 |

FOREIGN PATENT DOCUMENTS

WO 2017044283 A1 3/2017

OTHER PUBLICATIONS

Adel, et al., "Diffraction order control in overlay metrology—a review of the roadmap options," Proc. Of SPIE vol. 6922, 692202-1 (2008).

* cited by examiner

*Primary Examiner* — Rebecca C Bryant
(74) *Attorney, Agent, or Firm* — Suiter Swantz IP

(57) ABSTRACT

An overlay metrology system may illuminate overlay targets sample with a dipole pair of illumination beams, generate a first set of metrology data associated with two or more cells having nonzero offset values from a first set of the overlay targets, determine overlay measurements for the first set of overlay targets, determine effective stack heights representative of an effective distance between layers at the locations of the first set of the overlay targets, generate a second set of metrology data from a second set of the overlay targets, determine the effective stack heights at locations of the second set of the overlay targets based on the first effective stack heights, and determine overlay measurements for the second set of overlay targets based on the effective stack heights at the locations of the second set of the overlay targets and the second set of metrology data.

27 Claims, 11 Drawing Sheets

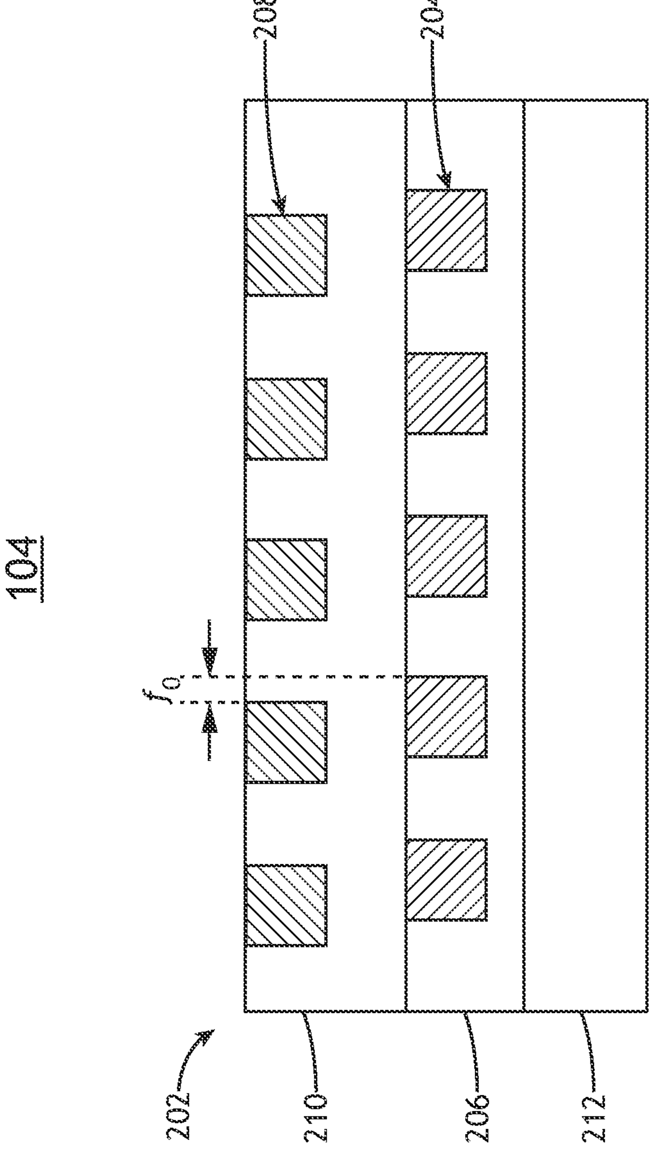
FIG. 2B
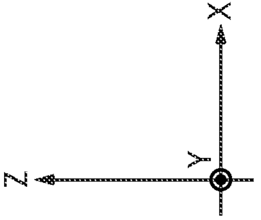

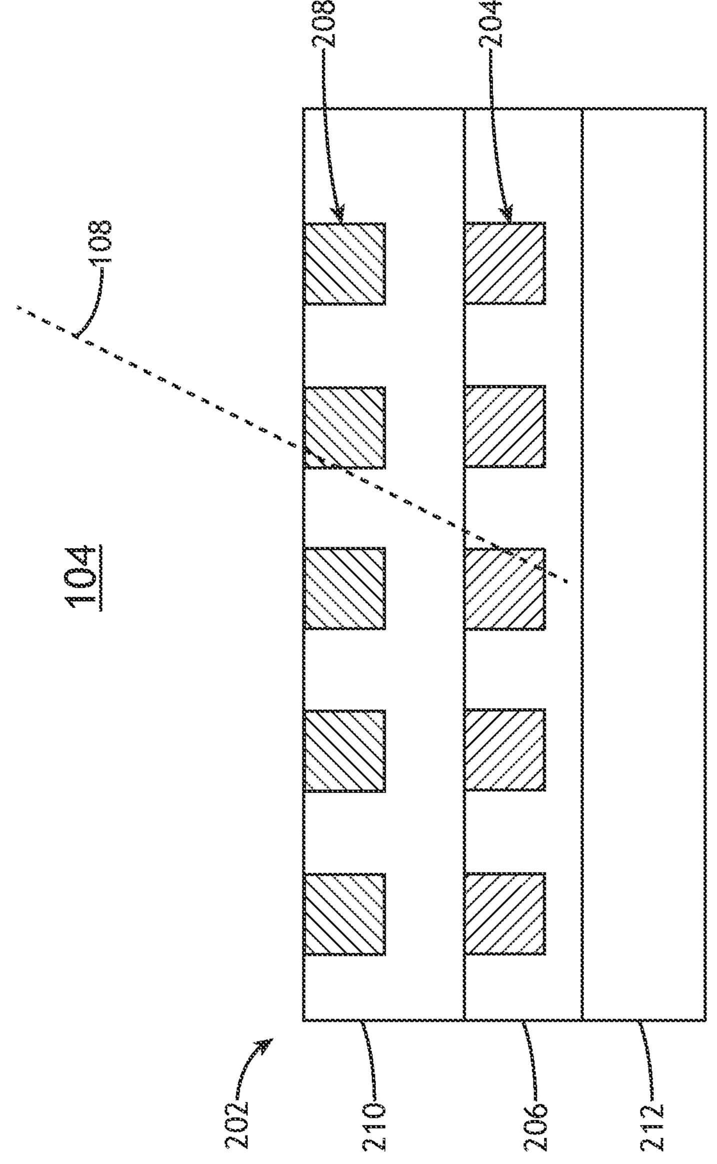
FIG. 4A
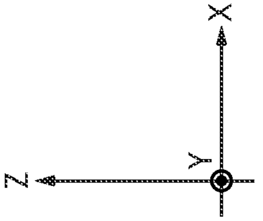

PARALLAX METHOD FOR A SINGLE-CELL DIFFRACTION BASED MEASUREMENT OF MISREGISTRATION

CROSS-REFERENCE TO RELATED APPLICATION

The present application claims the benefit under 35 U.S.C. § 119(e) of U.S. Provisional Application Ser. No. 63/311,444, filed Feb. 17, 2022, entitled PARALLAX METHOD FOR A SINGLE-CELL DIFFRACTION BASED MEASUREMENT OF MISREGISTRATION, naming Mordechy Kot and Yuval Lamhot as inventors, which is incorporated herein by reference in the entirety.

TECHNICAL FIELD

The present disclosure relates generally to scatterometry overlay metrology and, more particularly, to single-cell scatterometry overlay metrology.

BACKGROUND

Scatterometry overlay metrology techniques typically generate overlay measurements based on data collected from two or more cells of an overlay target, where each cell includes a grating-over-grating structure with a different intentional offset. However, this approach requires alignment of a metrology tool to each required cell, which negatively impacts measurement throughput and may introduce inaccuracies due to navigation calibration errors and/or unintended differences between the cells. Further, such two-cell designs may be relatively large, which may be too large to be placed in some areas of a sample such as within dies and may further lead to reduced yield. There is therefore a desire to develop systems and methods to cure the above deficiencies.

SUMMARY

An overlay metrology system is disclosed in accordance with one or more illustrative embodiments. In one illustrative embodiment, the system includes a controller configured to be coupled to an optical sub-system for characterizing a sample in accordance with a metrology recipe. In another illustrative embodiment, the sample includes a plurality of overlay targets, each having one or more cells including overlapping first and second structures on two layers of the sample, where the first and second structures in each of the cells is characterized by an offset value $f_0$. In another illustrative embodiment, the optical sub-system is configured to illuminate the sample with a pair of illumination beams per measurement direction when implementing the metrology recipe, where the illumination beams in each pair have a common altitude incidence angle and opposing azimuth incidence angles along the respective measurement direction. In another illustrative embodiment, the controller implements the metrology recipe by receiving a first set of metrology data from the optical sub-system, wherein the first set of metrology data is associated with two or more cells per measurement direction having nonzero offset values from a first set of the overlay targets, determining overlay measurements per direction for the first set of overlay targets based on the first set of metrology data, generating effective stack heights representative of an effective distance between the first and second structures at the locations of the first set of the overlay targets based on the first set of metrology data, receiving a second set of metrology data from the optical sub-system associated with a single cell per measurement direction from a second set of the overlay targets, determining the effective stack heights at locations of the second set of the overlay targets based on the effective stack heights at the locations of the first set of the overlay targets, and determining overlay measurements per direction for the second set of overlay targets based on the effective stack heights at the locations of the second set of the overlay targets and the second set of metrology data.

An overlay metrology system is disclosed in accordance with one or more illustrative embodiments. In one illustrative embodiment, the system includes an optical sub-system with one or more optical elements to illuminate a sample with a pair of two illumination beams per measurement direction when implementing a metrology recipe, where the illumination beams in each pair of illumination beams have a common altitude incidence angle and opposing azimuth incidence angles along the respective measurement direction, where the sample in accordance with the metrology recipe includes a plurality of overlay targets, each having one or more cells including overlapping first and second structures on two layers of the sample, and where the first and second structures in each of the cells is characterized by an offset value $f_0$. In another illustrative embodiment, the system includes a detector. In another illustrative embodiment, the system includes one or more optical elements configured to direct at least a portion of the light from the sample to the detector. In another illustrative embodiment, the system includes a controller to implement the metrology recipe by receiving a first set of metrology data from the optical sub-system associated with two cells per measurement direction having nonzero offset values of $\pm f_0$ from a first set of the overlay targets, determining overlay measurements per direction for the first set of overlay targets based on the first set of metrology data, generating effective stack heights representative of an effective distance between the first and second structures at the locations of the first set of overlay targets based on the first set of metrology data, receiving a second set of metrology data from the optical sub-system associated with a single cell per measurement direction from a second set of the overlay targets, determining the effective stack heights at locations of the second set of the overlay targets based on the effective stack heights at the locations of the first set of the overlay targets, and determining overlay measurements per direction for the second set of overlay targets based on the effective stack heights.

An overlay metrology method is disclosed in accordance with one or more illustrative embodiments. In one illustrative embodiment, the method includes generating a first set of metrology data with an optical sub-system, where the optical sub-system is configured to illuminate a sample with a pair of illumination beams per measurement direction when implementing a metrology recipe, where the illumination beams in each pair have a common altitude incidence angle and opposing azimuth incidence angles along the respective measurement direction, where the sample in accordance with the metrology recipe includes a plurality of overlay targets, each having one or more cells including overlapping first and second structures on two layers of the sample, where the first and second structures in each of the cells is characterized by an offset value $f_0$, and where the first set of metrology data is associated with two cells per measurement direction having nonzero offset values of $\pm f_0$ from a first set of the overlay targets. In another illustrative embodiment, the method includes determining overlay measurements per direction for the first set of overlay targets based on the first set of metrology data. In another illustrative embodiment, the method includes generating effective stack heights representative of an effective distance between the first and second structures at the locations of the first set of the overlay targets based on the first set of metrology data. In another illustrative embodiment, the method includes generating a second set of metrology data with the optical sub-system associated with a single cell per measurement direction from a second set of the overlay targets. In another illustrative embodiment, the method includes determining the effective stack heights at locations of the second set of the overlay targets based on the effective stack heights at the locations of the first set of the overlay targets. In another illustrative embodiment, the method includes determining overlay measurements per direction for the second set of overlay targets based on the effective stack heights at the locations of the second set of the overlay targets and the second set of metrology data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 2B is a side view of the single cell in FIG. 2A, in accordance with one or more embodiments of the present disclosure.

FIG. 4A is a side view of a cell of an overlay target including a grating-over-grating structure with no intended offset, in accordance with one or more embodiments of the present disclosure.

DETAILED DESCRIPTION

Figure 1A:
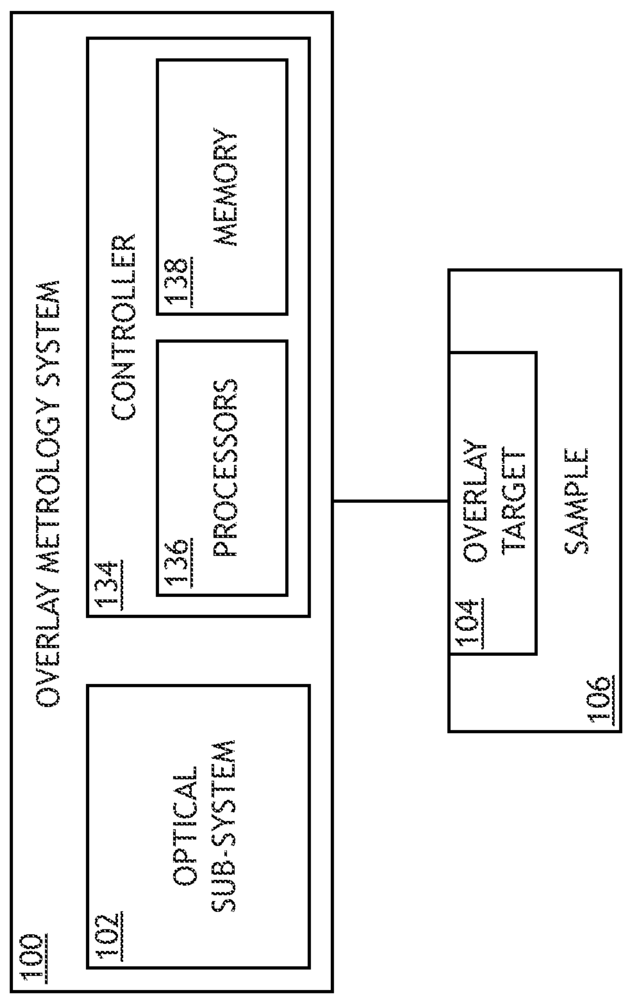
FIG. 1A is a block diagram view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scatterometry overlay metrology (SCOL) measurements of single-cell overlay targets on a sample by exploiting a parallax effect associated with off-axis illumination.

SCOL techniques may generally utilize overlay targets including two or more cells per direction, where each of the cells includes overlapping features on two or more layers of a sample, and where the cells are fabricated with different intended offsets between the overlapping features. In a general sense, the features associated with each layer are 180-degree rotationally symmetric such that a cell is 180-degree rotationally symmetric when no intended offset is present. In some embodiments, the features of a cell are periodic and may be characterized by at least one pitch or spatial frequency. Such periodic features may thus generate discrete diffraction orders. For example, a cell may include grating structures (or gratings) on each layer of interest, where the overlapping grating structures may be referred to as grating-over-grating structures. However, it is to be understood that features on a particular sample layer may be characterized by multiple pitches along a particular direction and/or by multiple pitches along different directions. For instance, features of a grating-over-grating structure may be segmented to provide multiple pitches in any combination of directions or otherwise distributed to provide spatial frequencies suitable for generating diffraction of incident light. Further, any references to the term "grating-over-grating structure" in the present disclosure are merely illustrative and should not be interpreted as limiting the disclosure. Rather, any such references may be understood to encompass or extend to any suitable 180-degree rotationally symmetric features suitable for SCOL techniques. For example, various examples herein may refer to diffraction orders for illustrative purposes. However, SCOL measurements may be performed on one or more cells including non-periodic overlapping features based on the entire reflected signal (e.g., the entire pupil plane).

SCOL measurements are based on metrology data generated by illuminating a cell and collecting the resulting light from the cell. In the case of grating-over-grating structures, this resulting light may include one or more diffraction orders. As an illustration, first-order SCOL techniques may be based on metrology data associated with first-order diffraction from grating-over-grating structures, where the first-order diffraction may be resolvable in a pupil plane (e.g., as diffraction lobes) and/or in a field plane (e.g., as regions of constant intensity). As another illustration, zero-order SCOL techniques may be based on metrology data associated with zero-order light from an overlay target such as, but not limited to, zero-order diffraction or opposite-order diffraction from overlapping grating-over-grating structures (e.g., positive first-order diffraction from a grating structure in one layer and negative first-order diffraction from a grating structure in another layer). Various non-limiting examples of SCOL techniques are generally described in Adel, et al., "Diffraction order control in overlay metrology—a review of the roadmap options," Proc. Of SPIE Vol. 6922, 692202-1 (2008); U.S. Pat. No. 7,317,531 entitled "Apparatus and methods for detecting overlay errors using scatterometry" and issued on Jan. 8, 2008; U.S. Pat. No. 10,197,389 entitled "Approaches in first order scatterometry overlay based on introduction of auxiliary electromagnetic fields" and issued on Feb. 5, 2019; and International Publication Number WO 2017/044283 entitled "New Approaches in First Order Scatterometry Overlay Based on Introduction of Auxiliary Electromagnetic Fields" and published on Mar. 16, 2017; all of which are incorporated herein by reference in their entireties.

It is recognized herein that SCOL techniques typically require overlay targets with multiple cells, where each cell has a different intended offset (e.g., intended physical overlay). In such a configuration, the metrology data of the various cells is used to generate a measurement of unintended overlay (e.g., unintended physical overlay) at a location of the overlay target. Different SCOL techniques based on different diffraction orders may generally require different numbers of cells in an overlay target to generate a measurement. Continuing the illustration above, first-order SCOL techniques based on cells with grating-over-grating structures may typically require two-cell overlay targets and generate measurements based on both positive and negative first-order diffraction from each cell.

It is contemplated herein that illuminating a cell without a fabricated intended offset between features on two sample layers with an off-axis illumination beam may be conceptually similar to illuminating a cell with a fabricated intended offset with normal illumination due to the parallax effect. Put another way, an off-axis illumination beam may see an apparent offset between features on two sample layers, where a magnitude of the apparent offset is related to the illumination angle and an axial distance between the features. Extending this concept, illuminating a single cell having no intended offset with dipole illumination including two off-axis illumination beams may be conceptually similar to illuminating two cells having physical offsets. As a result, a SCOL measurement may be generated using a single cell having no intended offset rather than two or more cells having intended offsets, which may substantially improve both measurement efficiency and target size by reducing a number of cells to be measured.

In some embodiments, a value representative of the axial separation between sample layers as it relates to the apparent offset is calibrated at one or more locations across the sample. It is contemplated herein that the axial separation between sample layers as it relates to the apparent offset may be a complex function of parameters such as, but not limited to, thicknesses and refractive indices of sample layers and fabricated features thereon. For the purposes of the present disclosure, this value is referred to herein as an effective stack height. Further, these parameters may vary across a sample or between samples due to process variations within typical fabrication tolerances. As a result, it may be necessary to determine or model the effective stack height at each location at which the parallax technique disclosed herein is utilized.

In some embodiments, the effective stack height is determined by illuminating cells of typical multi-cell SCOL target having known intended offsets with the off-axis illumination beams. In this way, a relationship between the effective stack height and the illumination conditions used for parallax measurements may be generated.

In some embodiments, a sample (or a metrology recipe defining target locations on a sample) includes a first set of overlay targets having two or more cells with intended offsets and a second set of overlay targets having a single cell and no intended offset. In this way, efficient metrology may be performed by generating metrology data for both the first and second sets of overlay targets. The effective stack height (as well as full overlay measurements) may be determined at locations of the first set of overlay targets. A model of the effective stack height across the wafer may then be generated to provide values of the effective stack height at locations of the second set of overlay targets. Finally, overlay measurements at the locations of the second set of overlay targets may be determined based on the metrology data at these locations and the effective stack height values at these locations.

Referring now to FIGS. 1A-8, systems and methods for efficient SCOL metrology are described in greater detail, in accordance with one or more embodiments of the present disclosure.

FIG. 1A is a block diagram view of an overlay metrology system 100, in accordance with one or more embodiments of the present disclosure.

In embodiments, the overlay metrology system 100 includes an optical sub-system 102 to generate metrology data from an overlay target 104 on a sample 106. For example, the overlay target 104 may include one or more cells, each including a grating-over-grating structure. The optical sub-system 102 may be a SCOL metrology sub-system to generate metrology data associated with diffraction orders from the overlay target 104.

Figure 2A:
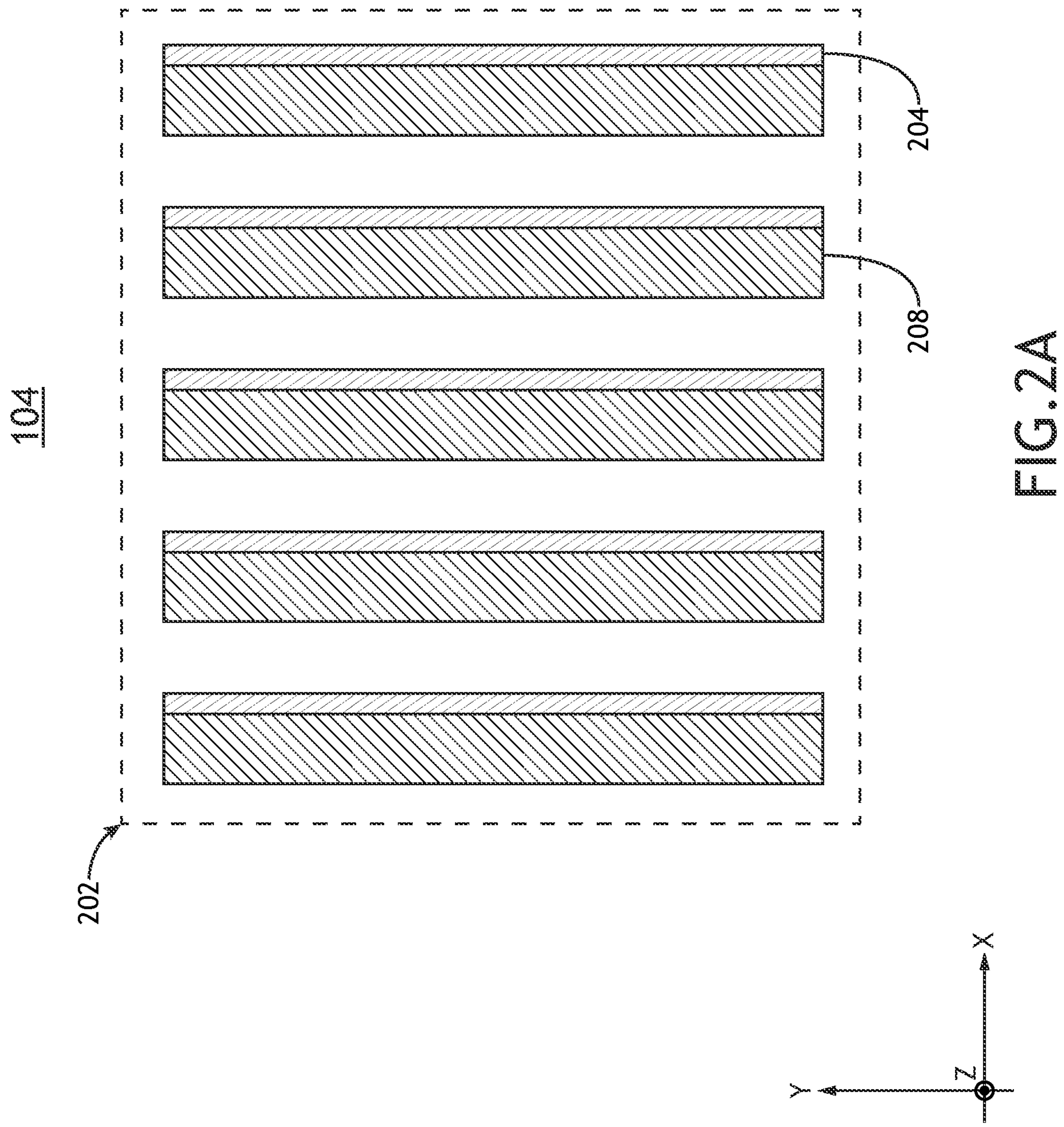
FIG. 2A is a top view of a single cell of an overlay target with a grating-over-grating structure, in accordance with one or more embodiments of the present disclosure.

FIGS. 2A-2B depict an overlay target 104 suitable for SCOL metrology techniques, in accordance with one or more embodiments of the present disclosure.

FIG. 2A is a top view of single cell 202 of an overlay target 104 with a grating-over-grating structure, in accordance with one or more embodiments of the present disclosure. FIG. 2B is a side view of the single cell 202 in FIG. 2A, in accordance with one or more embodiments of the present disclosure.

In one embodiment, the cell 202 includes first-layer printed elements 204 located on a first layer 206 of the sample 106 and second-layer printed elements 208 located on a second layer 210 of the sample 106 oriented such that the regions including the first-layer printed elements 204 and the second-layer printed elements 208 overlap to form a grating-over-grating structure. FIG. 2B further depicts a substrate 212 beneath the first-layer printed elements 204 and the second-layer printed elements 208.

The first-layer printed elements 204 and the second-layer printed elements 208 in any particular cell 202 may be designed to have any intended offset ($f_0$) along any direction (e.g., the X direction in FIG. 2B corresponding to a measurement direction). For example, an intended offset of zero ($f_0=0$) may provide that the first-layer printed elements 204 and the second-layer printed elements 208 fully overlap when the physical overlay is also zero (e.g., no overlay error). In this configuration, a relative shift between the first-layer printed elements 204 and the second-layer printed elements 208 is indicative of overlay error during fabrication. As another example, a non-zero intended offset ($f_0 \neq 0$) may provide that the first-layer printed elements 204 and the second-layer printed elements 208 exhibit this intended offset when the physical overlay is zero (e.g., no overlay error).

Figures 3A, 3B:
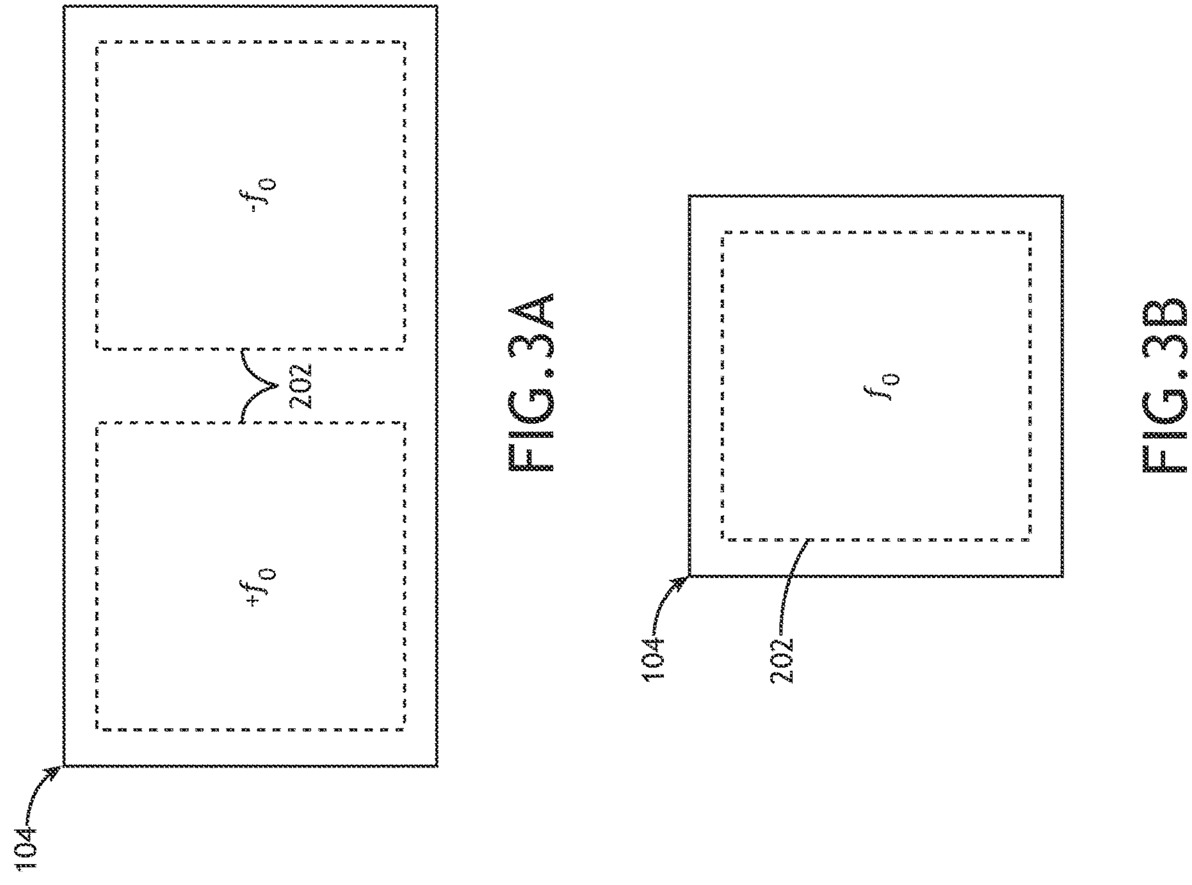
FIG. 3A is a top conceptual view of an overlay target having two cells with equal and opposite non-zero intended offsets, in accordance with one or more embodiments of the present disclosure.
FIG. 3B is a top conceptual view of an overlay target having a single cell, in accordance with one or more embodiments of the present disclosure.

An overlay target 104 may generally be formed from any number of cells 202 that may have any combination of intended offsets (e.g., values of $f_0$). As a non-limiting illustration, FIG. 3A is a top conceptual view of an overlay target 104 having two cells 202 with equal and opposite non-zero intended offsets, in accordance with one or more embodiments of the present disclosure. In particular, a first cell 202 in FIG. 3A has an intended offset of $+f_0$ and a second cell 202 in FIG. 3A has an intended offset of $-f_0$, where $f_0$ may be any non-zero number. As another non-limiting illustration, FIG. 3B is a top conceptual view of an overlay target 104 having a single cell 202, in accordance with one or more embodiments of the present disclosure. In this configuration, the cell 202 may have any intended offset including a zero ($f_0=0$) or a non-zero value ($f_0 \neq 0$).

Although not explicitly illustrated, an overlay target 104 may be suitable for overlay measurements along multiple directions (e.g., orthogonal directions). In general, a measurement direction may correspond to direction of periodicity of the first-layer printed elements 204 and the second-layer printed elements 208 (e.g., a direction of periodicity of the grating-over-grating structure). As an illustration, the cell 202 depicted in FIGS. 2A and 2B exhibits periodicity along the X direction and is suitable for overlay measurements along the X direction.

In some embodiments, an overlay target 104 includes one or more cells 202 having periodicity along a first direction (e.g., the X direction as depicted in FIGS. 2A and 2B) and one or more cells having periodicity along a second direction (e.g., the Y direction as depicted in FIGS. 2A and 2B). In some embodiments, an overlay target 104 includes one or more cells 202 having periodicity along two directions simultaneously. For example, the first-layer printed elements 204 and the second-layer printed elements 208 may include structures that are periodic in both the X and Y directions (e.g., a hatch pattern, a grid of square or rectangular structures, or the like).

Referring generally to FIGS. 2A and 2B, it is to be understood that FIGS. 2A and 2B, along with the associated descriptions, are merely illustrative and should not be interpreted as limiting on the present disclosure. For example, the first layer 206 and the second layer 210 may generally have any thicknesses. As another example, the sample 106 may include any number of layers between the first-layer printed elements 204 and the second-layer printed elements 208 and/or between the first-layer printed elements 204 and the substrate 212. As another example, the first-layer printed elements 204 and the second-layer printed elements 208 may generally include any 180-degree rotationally symmetric features and need not include grating-over-grating or even periodic features.

Figure 1B:
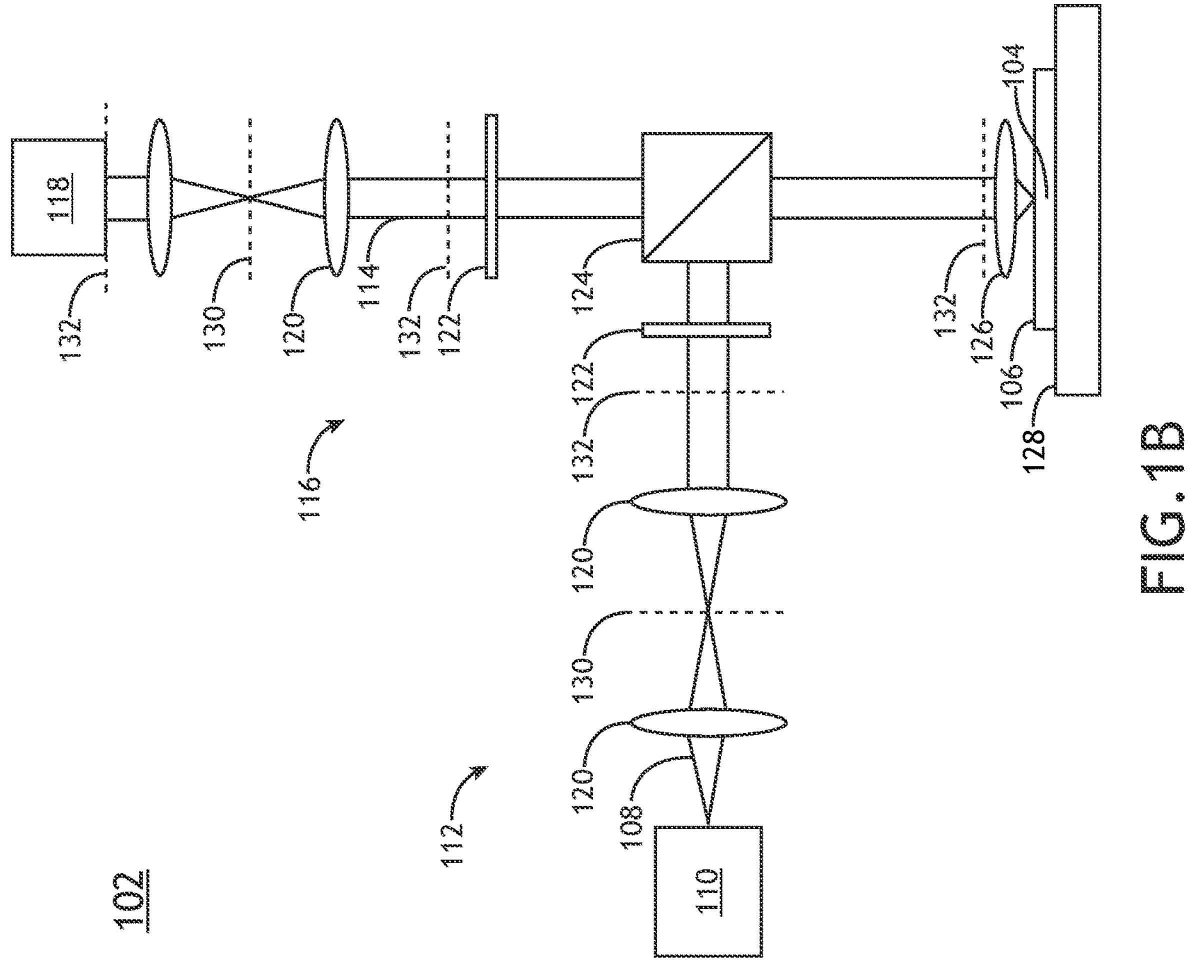
FIG. 1B is a simplified schematic of the optical sub-system, in accordance with one or more embodiments of the present disclosure.

Referring now to FIG. 1B, various aspects of the optical sub-system 102 are described in greater detail, in accordance with one or more embodiments of the present disclosure. FIG. 1B is a simplified schematic of the optical sub-system 102, in accordance with one or more embodiments of the present disclosure.

In embodiments, the optical sub-system 102, is configurable according to a metrology recipe (e.g., an overlay recipe) to generate an overlay measurement associated with an overlay target 104 having a design based on the metrology recipe. For example, the optical sub-system 102 may direct one or more illumination beams 108 from an illumination source 110 to an overlay target 104 on the sample 106 (e.g., via an illumination pathway 112), collect light or other radiation emanating from the overlay target 104 in response to the (referred to herein as measurement light 114) (e.g., via a collection pathway 116), and generate metrology data from at least one detector 118 based on the measurement light 114. For example, metrology data may be associated with diffraction of the illumination beams 108 from the overlay target 104. The illumination pathway 112 and the collection pathway 116 may further include additional optical elements such as, but not limited to, lenses 120 and beam manipulation components 122 (e.g., apodizers, polarizers, spectral filters, spatial filters, pupil filters, beam blockers, apertures, or the like) at any suitable locations. In some embodiments, as illustrated in FIG. 1B, the optical sub-system 102 includes one or more beamsplitters 124 to allow simultaneous illumination and collection through a common objective lens 126 or other focusing element. In some embodiments, the optical sub-system 102 includes an apodizer to limit a wide illumination beam 108 to specific incident illumination angles or collection of angles. In some embodiments, the optical sub-system 102 includes a translation stage 128 including any number of linear or rotational actuators to secure and/or position the sample 106. Further, any of the components in the illumination pathway 112 and/or the collection pathway 116 may be, but are not required to be, located at a field plane 130 (e.g., a plane conjugate to the sample 106) or a pupil plane 132 (e.g., a diffraction plane corresponding to an angular distribution of light from the sample 106), which are illustrated in FIG. 1B.

The optical sub-system 102 may include one or more detectors 118 at any suitable locations for the collection of metrology data. For example, though not explicitly illustrated, the optical sub-system 102 may include at least one detector 118 at a pupil plane 132 Further, although not illustrated, the optical sub-system 102 may include multiple channels, each having a separate detector 118. In this way, the optical sub-system 102 may provide multiple simultaneous measurements using multiple detectors 118. For example, the optical sub-system 102 may include one or more additional beamsplitters (e.g., non-polarizing beamsplitters, polarizing beamsplitters, dichroic mirrors providing spectral selectivity, or the like) to split the measurement light 114 into the different channels for detection. The optical sub-system 102 may further include optical components to modify the properties of the measurement light 114 within each channel such as, but not limited to, polarizers, polarization rotators, spectral filters, spatial filters, or pupil filters (e.g., beam blocks or apertures in a pupil plane to block or pass selected diffraction orders).

Some embodiments of the present disclosure are directed to providing recipes for configuring the optical sub-system 102 to facilitate an overlay measurement based on selected diffraction orders. A metrology recipe may include a set of parameters for controlling various aspects of an overlay measurement such as, but not limited to, the illumination of a sample, the collection of light from the sample, or the position of the sample during a measurement. In this way, the optical sub-system 102 may be configured to provide a selected type of measurement for a selected overlay target design. For example, a metrology recipe may include parameters of the illumination beams 108 such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the overlay target 104 to be used for a measurement and associated filtered intensities at those angles), collection field stop settings to select portions of the overlay target 104 of interest, polarization of collected light, wavelength filters, or parameters for controlling one or more detectors. By way of another example, a metrology recipe may include various parameters associated with a design of the overlay target 104 such as, but not limited to, positions and orientations of sample features (e.g., pitches of grating features along particular directions). By way of a further example, a metrology recipe may include various parameters associated with the position of the sample 106 during a measurement such as, but not limited to, a sample height, a sample orientation, whether a sample is static during a measurement, or whether a sample is in motion during a measurement (along with associated parameters describing the speed, scan pattern, or the like).

In this way, the optical sub-system 102 may be configurable according to a metrology recipe to provide a selected distribution of light in a collection pupil when analyzing a particular overlay target 104 with a known design. This distribution of light in the collection pupil may then be further modified by various optics as desired to produce a desired overlay measurement.

In some embodiments, the overlay metrology system 100 further includes a controller 134 with one or more processors 136 configured to execute program instructions maintained on memory 138 (e.g., a memory medium). The controller 134 may be communicatively coupled with any of the components of the overlay metrology system 100 such as, but not limited to the detector 118. In this way, the controller 134 may generate overlay measurements based on the detection signals in accordance with the metrology recipe.

The one or more processors 136 of a controller 134 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 136 may include any device configured to execute algorithms and/or instructions (e.g., program instructions stored in memory). In one embodiment, the one or more processors 136 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 134 or, alternatively, multiple controllers. Additionally, the controller 134 may include one or more controllers housed in a common housing or within multiple housings. In this way, any controller or combination of controllers may be separately packaged as a module suitable for integration into the overlay metrology system 100.

The memory 138 may include any storage medium known in the art suitable for storing program instructions executable by the associated one or more processors 136. For example, the memory 138 may include a non-transitory memory medium. By way of another example, the memory 138 may include, but is not limited to, a read-only memory (ROM), a random-access memory (RAM), a magnetic or optical memory device (e.g., disk), a magnetic tape, a solid-state drive and the like. It is further noted that the memory 138 may be housed in a common controller housing with the one or more processors 136. In one embodiment, the memory 138 may be located remotely with respect to the physical location of the one or more processors 136 and controller 134. For instance, the one or more processors 136 of the controller 134 may access a remote memory (e.g., server), accessible through a network (e.g., internet, intranet and the like).

Referring now generally to FIGS. 2A-8, overlay metrology based on parallax associated with off-axis illumination of features on different layers of a sample 106 is described in greater detail, in accordance with one or more embodiments of the present disclosure.

Figure 4B:
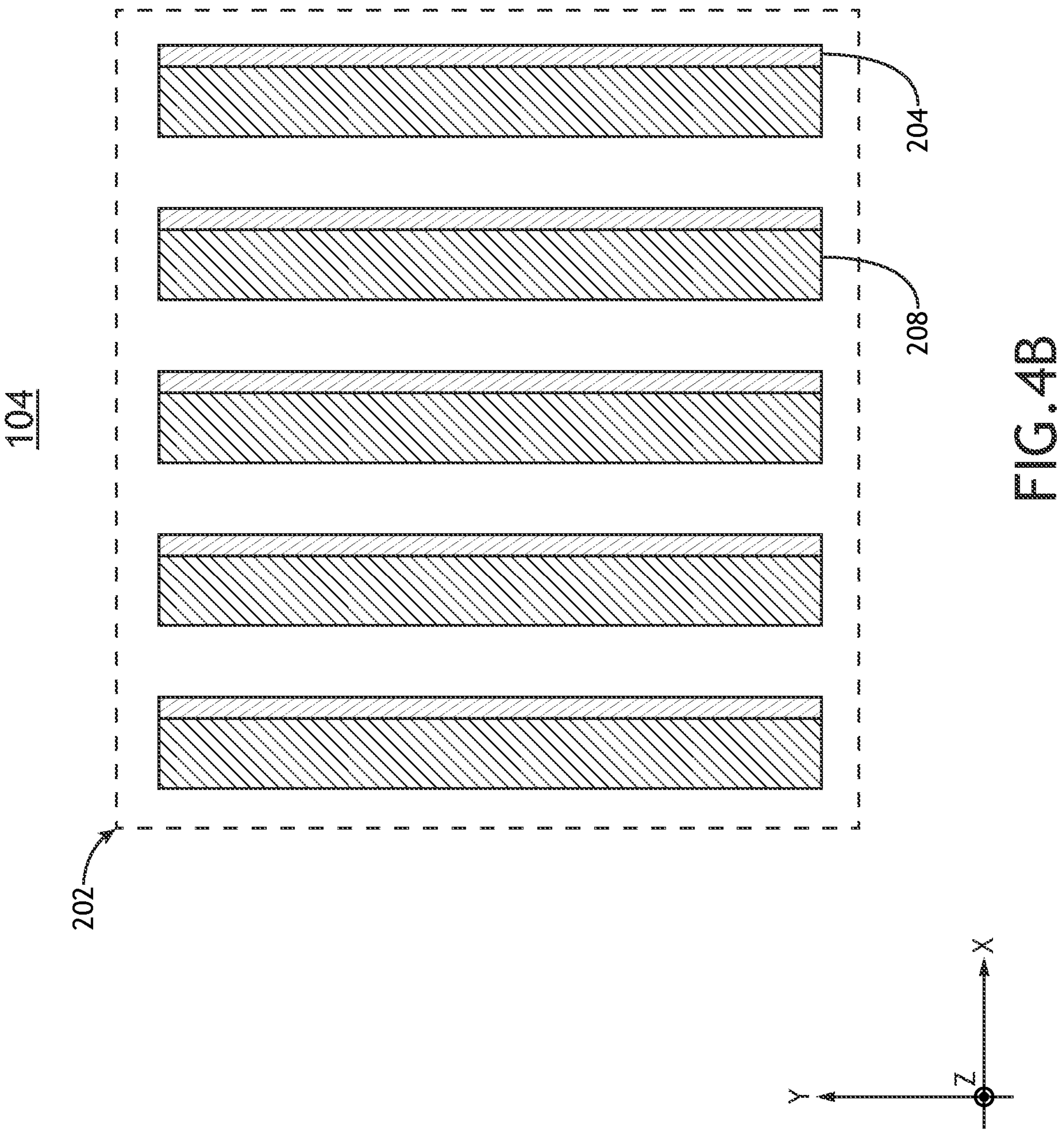
FIG. 4B is a top view of the cell of FIG. 4A as viewed along a path of the illumination beam, in accordance with one or more embodiments of the present disclosure.

FIGS. 4A and 4B illustrate the parallax effect associated with off-axis illumination of a grating-over-grating structure, though it is emphasized that the depiction of a grating-over-grating structure is merely illustrative and not limiting.

FIG. 4A is a side view of a cell 202 of an overlay target 104 including a grating-over-grating structure with no intended offset (e.g., $f_0=0$), in accordance with one or more embodiments of the present disclosure. It is noted that FIG. 4A is substantially similar to FIG. 2B and depicts the case of no intended offset.

FIG. 4A further depicts an illumination beam 108 incident on the cell 202 with an incidence angle $\theta_i$. It is noted that although the first-layer printed elements 204 and the second-layer printed elements 208 are aligned in the horizontal direction of the figure, the illumination beam 108 interacts with the first-layer printed elements 204 and the second-layer printed elements 208 asymmetrically.

FIG. 4B is a top view of the cell 202 of FIG. 4A as viewed along a path of the illumination beam 108, in accordance with one or more embodiments of the present disclosure. As illustrated in FIGS. 4A and 4B, the first-layer printed elements 204 and the second-layer printed elements 208 have an apparent offset $f_0'$ due to the parallax effect, which may generally be a function of the incidence angle $\theta_i$ and an axial separation between the first-layer printed elements 204 and the second-layer printed elements 208 (e.g., along the vertical direction of the figure). For instance, this apparent offset $f_0'$ may be approximated as $$f_0' \sim \theta_i \cdot z \quad (1)$$

where z is an effective stack height representative of the axial separation between the first-layer printed elements 204 and the second-layer printed elements 208.

It is contemplated herein that a diffraction pattern associated with off-axis illumination of a cell 202 without an intended offset (e.g., $f_0=0$) as depicted in FIGS. 4A-4B is analogous to a diffraction pattern associated with a similar cell 202 with a non-zero intended offset equal to the apparent offset (e.g., $f_0=f_0'$). As a result, any SCOL technique based on multiple cells 202 having non-zero physically-fabricated intended offsets may be performed using analogous metrology data generated by illumination with two or more off-axis illumination beams 108. As an illustration, whereas a typical first-order SCOL technique may determine an overlay measurement based on differential signals associated with opposing first-order diffraction (e.g., an amplitude difference between +1 and −1 order diffraction or an amplitude difference between opposing pupil coordinates more generally) from two cells 202 with known non-zero intended offsets (e.g., $\pm f_0$), embodiments of the present disclosure may generate an overlay measurement based on differential signals associated with opposing first-order diffraction from a single cell 202 illuminated with two off-axis illumination beams 108 providing non-zero apparent offsets (e.g., $\pm f_0'$). It is to be understood that this approach may be broadly extended to any technique and any number of cells 202 with non-zero intended offsets.

Overlay calculations based on apparent offsets associated with off-axis illumination are now described in greater detail, in accordance with one or more embodiments of the present disclosure.

Figure 5:
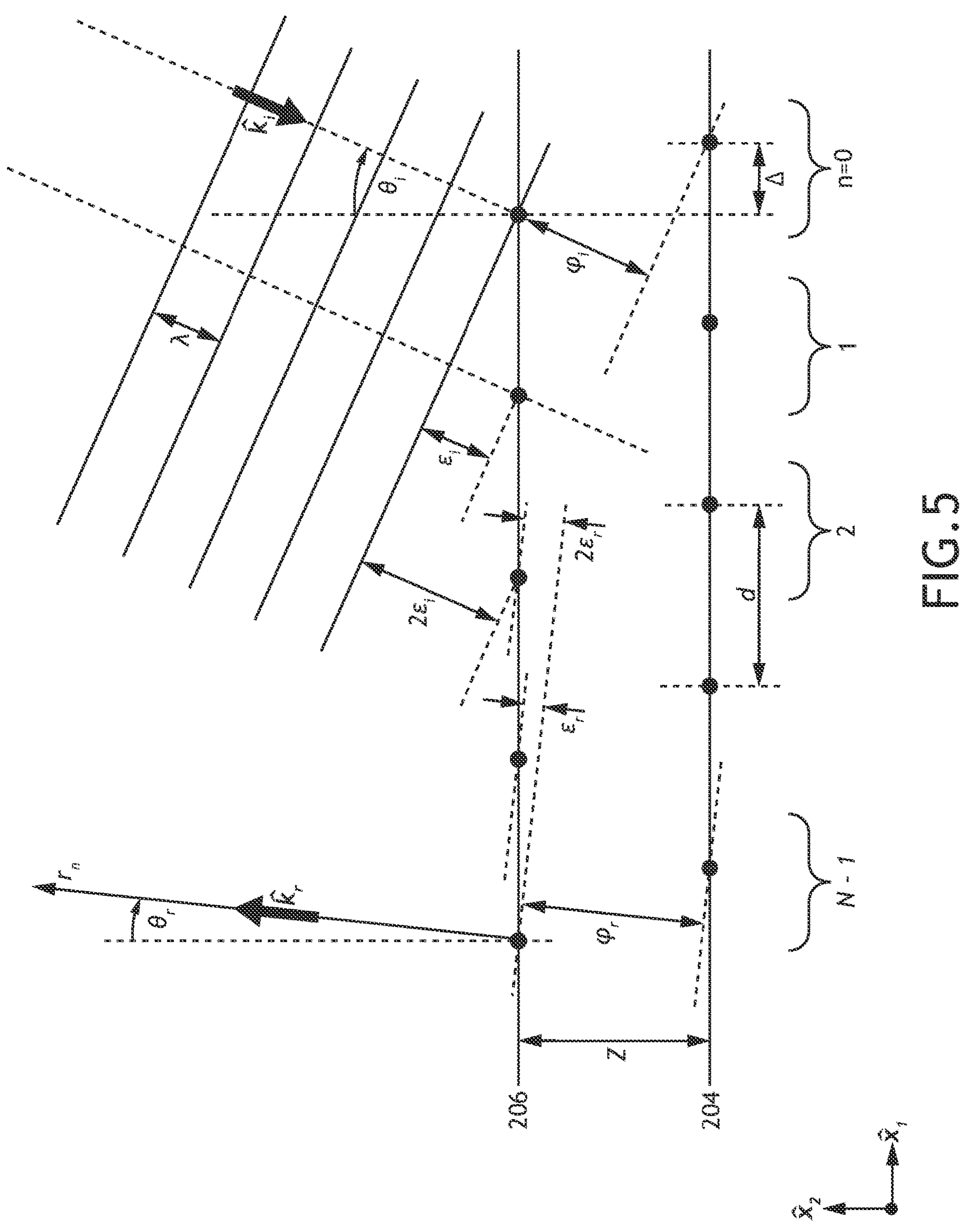
FIG. 5 is a simplified model of a cell with a grating-over-grating structure illuminated by an off-axis illumination beam, in accordance with one or more embodiments of the present disclosure.

FIG. 5 is a simplified model of a cell 202 with a grating-over-grating structure illuminated by an off-axis illumination beam 108, in accordance with one or more embodiments of the present disclosure. In FIG. 5, a detector 118 is located above the cell 202.

The first-layer printed elements 204 and the second-layer printed elements 208 each constitute gratings with pitch d and are separated by an effective stack height of z. The gratings are shifted by a small overlay A, which is defined as positive in FIG. 5 when the first-layer printed elements 204 are shifted downward vertically in the figure. Each grating is shown as having N bars and the gratings are illuminated at an incident angle $\theta_i$. In this formulation, $\theta_i$ and all other angles may be defined as positive in the clockwise direction.

Figure 6:
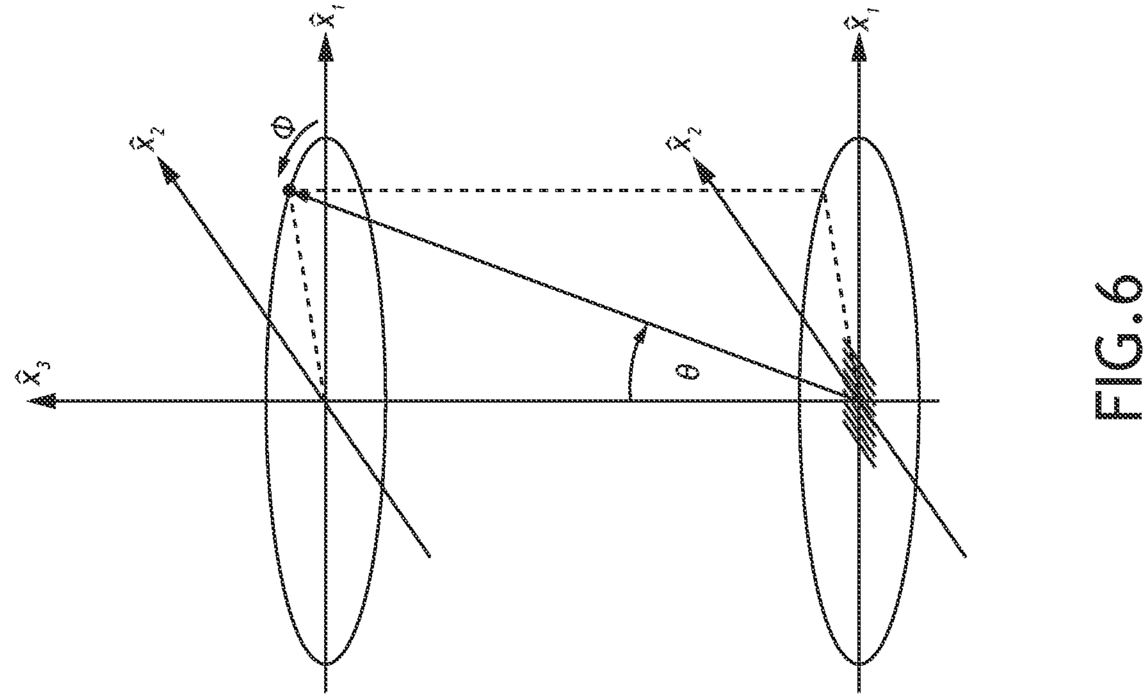
FIG. 6 is a schematic depiction of a 3D coordinate system that may be used in the calculation of overlay, in accordance with one or more embodiments of the present disclosure.

FIG. 6 is a schematic depiction of a 3D coordinate system that may be used in the calculation of overlay, in accordance with one or more embodiments of the present disclosure. In a cylindrical system of coordinates defined in FIG. 6, the general direction vector may be written as:

$$\hat{r} = \sin\theta\cos\phi\ \hat{x}_1 + \sin\theta\sin\phi\ \hat{x}_2 + \cos\theta\ \hat{x}_3, \tag{2}$$

where $\hat{x}_1$ is in the direction of the measured overlay (perpendicular to the target features), $\hat{x}_2$ is perpendicular to the wafer plane, and $\hat{x}_3$ is perpendicular to both $\hat{x}_1$ and $\hat{x}_2$.

Let the displacement d of the target features (the pitch) be expressed as a vector $$\varepsilon_{i/r} = |a\cdot\hat{k}_{i/r}| = d\cdot\sin\theta_{i/r} \tag{3}$$

so that the illumination phase difference observed by two adjacent bars is $$\vec{d} = d\hat{x}_1$$

and let the displacement between the top and bottom gratings (containing both the height difference z, and the total horizontal shift between them Δ) be expressed as the vector $$\vec{\Delta} = \Delta\hat{x}_1 + z\hat{x}_3$$

so that the illumination phase difference observed between a top and bottom bar:

$$\varphi_{i/r} = |\vec{\Delta}\cdot\hat{k}_{i/r}| = z\cdot\cos\theta_{i/r} + \Delta\cdot\sin\theta_{i/r}. \tag{4}$$

In this configuration, the electric field on a detector 118 will be the sum of all the radiated waves coming from both layers, and can be expressed as the sum of the field originating from all points, each with its own carefully considered phase. This can be shown to be expressed as $$E = Ae^{ikr_0}\left[1 + e^{ik(\varphi_i+\varphi_r)}\right]\sum_{n=0}^{N-1}\left(e^{ik(\varepsilon_i+\varepsilon_r)}\right)^n \tag{5}$$

where $r_0$ is the optical path from the first bar on the top layer (e.g., the second-layer printed elements 208) to the detector 118, and A is the amplitude of the electric field.

One can then identify the sum as a geometric series and express its result as:

$$E = Ae^{ikr_0}e^{ik(N-1)\frac{\varepsilon_i+\varepsilon_r}{2}}\left[1 + e^{ik(\varphi_i+\varphi_r)}\right]\frac{\sin(Nk(\varepsilon_i+\varepsilon_r)/2)}{\sin(k(\varepsilon_i+\varepsilon_r)/2)}. \tag{6}$$

Calculating the intensity I=EE*/2, one can reach $$I = A^2\frac{\sin^2\left(Nk\frac{\varepsilon_i+\varepsilon_r}{2}\right)}{\sin^2\left(k\frac{\varepsilon_i+\varepsilon_r}{2}\right)}[1 + \cos(k(\varphi_i+\varphi_r))]. \tag{7}$$

Converting this to cartesian pupil-coordinates (e.g., corresponding to pixels on a detector 118 located in a pupil plane 132):

$$\sin\theta\cos\phi = x_1 \tag{8}$$

$$\sin\theta\sin\phi = x_2 \tag{9}$$

$$x_1^2 + x_2^2 = \sin^2\theta \tag{10}$$

$$\cos^2\theta = 1 - x_1^2 - x_2^2. \tag{11}$$

One can then express the illumination as $$I = A^2\frac{\sin^2\left(\frac{Nkd\cdot(x_{1_i}+x_{1_r})}{2}\right)}{\sin^2\left(\frac{kd\cdot(x_{1_i}+x_{1_r})}{2}\right)}\cos(kz\varphi(x_{1_i}, x_{2_i}, m + k\Delta\cdot(x_{1_i}+x_{1_r})) \tag{12}$$

$$\varphi(x_{1_i}, x_{2_i}, m) = \sqrt{1 - x_{1_i}^2 - x_{2_i}^2} + \sqrt{1 - \left(m\frac{\lambda}{d} - x_{1_i}\right)^2 - x_{2_i}^2}. \tag{13}$$

Every beam incident at some angle $x_{1_i}$ would reflect along a range of discrete angles $$x_{1_r} = -x_{1_i} + m\frac{\lambda}{d},\ m \in \mathbb{Z}. \tag{14}$$

where λ is the wavelength of the light.

For sufficiently large targets, every beam of incident angle $x_{2_i}$ pixel goes through mirror reflection:

$$x_{2_r} = -x_{2_i} \tag{15}$$

Taken together, for the illumination at every point is a function of the diffraction order and the angle of incidence alone:

$$I = A^2\frac{\sin^2(\pi mN)}{\sin^2(\pi m)}\cos\left(kz\varphi(x_{1_i}, x_{2_i}, m) + k\Delta\cdot(x_{1_i} + x_{1_r})\right). \tag{16}$$

Noting that since $$\varphi(x_{1_i}, x_{2_i}, m) = \varphi(-x_{1_i}, x_{2_i}, -m),$$

one can write $$I(-x_{1_i}, -m, \Delta) = I(x_{1_i}, m, -\Delta) \tag{17}$$

It is contemplated herein that this symmetry based on an off-axis illumination beam 108 (eq. 14) is analogous to the symmetry that conventional SCOL targets have with respect to the intended offset $f_0$:

$$I(-f_0, -m, \Delta) = I(f_0, m, -\Delta). \tag{18}$$

It is contemplated herein that this analogous symmetry depicted in Equations (17) and (18) indicates that SCOL techniques based on multiple cells 202 with non-zero intended offsets $f_0$ may be analogized to illumination of a single cell 202 with multiple off-axis illumination beams 108 by substituting $x_{1i}$ for $f_0$. For example, typical SCOL techniques may determine overlay based on differential signals based on opposing diffraction orders. In embodiments of the present disclosure, overlay may be determined based on analogous differential in which $x_{1i}$ is substituted for $f_0$.

As an illustration in the example of first-order SCOL techniques, one can define a positive differential signal associated with a first off-axis illumination beams 108:

$$D^+ = \frac{I(m, x_{1_i}, \Delta) - I(-m, x_{1_i}, \Delta)}{2} \tag{19}$$

$$D^- = \frac{I(m, -x_{1_i}, \Delta) - I(-m, -x_{1_i}, \Delta)}{2}. \tag{20}$$

From these expressions, one can generate K and G signals that are analagous to typical SCOL approaches. For example:

$$K = \frac{D^+ + D^-}{2} \tag{21}$$

$$G = \frac{D^+ - D^-}{2}. \tag{22}$$

These K and G signals may then be combined and, through the use of rudimentary trigonometric identities, be shown to take the form:

$$\frac{K(x_{1_i}, x_{2_i})}{G(x_{1_i}, x_{2_i})} = \frac{\tan\left(2\pi m\frac{\Delta}{d}\right)}{\tan\left(2\pi\delta\varphi(x_{1_i}, x_{2_i}, m)\frac{z}{\lambda}\right)} \tag{23}$$

$$\delta\varphi(x_{1_i}, m) = \frac{\varphi(x_{1_i}, m) - \varphi(x_{1_i}, -m)}{2} \tag{24}$$

with φ having been defined in eq. 12.

The overlay calculated thus for each point in the pupil may take the form $$\Delta(x_{1_i}, x_{2_i}) = \frac{d}{2\pi m}\tan^{-1}\left[\frac{K(x_{1_i}, x_{2_i})}{G(x_{1_i}, x_{2_i})}\tan\left(\delta\varphi(x_{1_i}, x_{2_i}, m)z\frac{2\pi}{\lambda}\right)\right]. \tag{25}$$

Equation (25) may be approximated to a linear order using tan x≈tan$^{-1}$ x≈x as:

$$\Delta(x_{1_i}, x_{2_i}) = z\delta\varphi(x_{1_i}, x_{2_i}, m)\frac{K(x_{1_i}, x_{2_i})}{G(x_{1_i}, x_{2_i})}. \tag{26}$$

It is noted herein that Equation (26) clearly illustrates that, in the parallax approach disclosed herein, the role of intended offset $f_0$ on different cells 202 is replaced with the stack height z with δφ being a known geometrical correction and a function of pupil coordinates.

A measurement of overlay may then correspond to a weighted pupil average in a manner analagous to typical techniques:

$$\langle\Delta\rangle = \frac{\sum_{x_{1_i}, x_{2_i}}\Delta(x_{1_i}, x_{2_i})G^2(x_{1_i}, x_{2_i})}{\sum_{x_{1_i}, x_{2_i}}G^2(x_{1_i}, x_{2_i})} \tag{27}$$

and likewise for any averaged pupil quantity.

It is further contemplated herein that for a fabricated overlay target 104, the effective stack height z as described in Equations (1)-(27) is generally unknown or at least not known with a suitable precision. Additionally, the effective stack height z as described in Equations (1)-(27) may generally depend on a variety of parameters such as, but not limited to, thicknesses of any of layers of the sample 106, thicknesses of target features within those layers, average refractive indices of the layers and features, opacity of the features, dimensions of the features, or the like.

In some embodiments, this effective stack height z is calibrated during an overlay measurement. Any suitable technique may be used to calibrate this effective stack height z.

In some embodiments, the effective stack height z is calibrated based on overlay measurements (or metrology data more generally) at a set of overlay targets 104 having non-zero intended offsets (e.g., non-zero values of $f_0$). For example, the effective stack height z may be determined based on metrology data associated with two cells 202 (per measurement direction) having known intended offsets (e.g., $\pm f_0$). Such targets may thus correspond to typical multi-cell overlay targets 104. In particular, an overlay measurement based on parallax techniques as disclosed herein (e.g., as illustrated by Equations (1)-(27)) may be determined for two cells 202 with known intended offsets, where a difference between these overlay measurements may be defined as the combination of these intended offsets. For the purposes of the present disclosure, such multi-cell overlay targets used to calibrate the effective stack height z are referred to herein as calibration targets.

As an illustration in the case of a calibration overlay target 104 having two cells 202 with intended offsets of $\pm f_0$, the difference between parallax-based overlay measurements of these two cells 202 may be equal to $2f_0$. Since $f_0$ is known, the value of the effective stack height at the location of such a calibration overlay target 104. Using Equation (26), one can write:

$$z\left\langle\frac{K_{cell1}(x_{1_i}, x_{2_i})\delta\varphi(x_{1_i}, x_{2_i}, m)}{G_{cell1}(x_{1_i}, x_{2_i})}\right\rangle - z\left\langle\frac{K_{cell2}(x_{1_i}, x_{2_i})\delta\varphi(x_{1_i}, x_{2_i}, m)}{G_{cell2}(x_{1_i}, x_{2_i})}\right\rangle = 2f_0. \tag{28}$$

In the linear approximation this gives a direct condition for z:

$$z = \frac{(2f_0)}{\left\langle\frac{K_{cell1}(x_{1_i}, x_{2_i})\delta\varphi(x_{1_i}, x_{2_i}, m)}{G_{cell1}(x_{1_i}, x_{2_i})}\right\rangle - \left\langle\frac{K_{cell2}(x_{1_i}, x_{2_i})\delta\varphi(x_{1_i}, x_{2_i}, m)}{G_{cell2}(x_{1_i}, x_{2_i})}\right\rangle}. \tag{29}$$

For the nonlinearized, accurate expression, one may find z by minimization of the term:

$$\left\{\frac{d}{2\pi m}\tan^{-1}\left[\left\langle\frac{K_1(x_{1_i}, x_{2_i})}{G_1(x_{1_i}, x_{2_i})}\tan\left(2\pi\delta\varphi(x_{1_i}, x_{2_i}, m)\frac{z}{\lambda}\right)\right\rangle\right] - \frac{d}{2\pi m}\tan^{-1}\left[\left\langle\frac{K_2(x_{1_i}, x_{2_i})}{G_2(x_{1_i}, x_{2_i})}\tan\left(2\pi\delta\varphi(x_{1_i}, x_{2_i}, m)\frac{2}{\lambda}\right)\right\rangle\right] - 2f_0\right\}^2. \tag{30}$$

It is contemplated herein that the effective stack height z may typically vary relatively slowly across a sample 106. For example, it is known that a thickness of a deposited layer on a sample 106 may typically vary with an approximate radial pattern across the sample 106 and may generally be independent of field or die coordinates. The effective stack height z may thus typically have a similar distribution.

In some embodiments, a model of the effective stack height z across a sample 106 is generated based on determinations of the effective stack height z at locations of calibration overlay targets 104. Such a model may then be used to determine values of the effective stack height z at locations of single-cell overlay targets 104, which may then be used for overlay measurements at the locations of the single-cell overlay targets 104 using the parallax techniques disclosed herein. Any suitable model may be used such as, but not limited to, a polynomial model, a spline model, or any other continuous modeling technique.

The calibration and single-cell overlay targets 104 may be distributed with any suitable layout on the sample 106. In a general sense, the benefits of using single-cell overlay targets 104 are reduced as the more calibration overlay targets 104 are needed. However, because the effective stack height z typically varies slowly across a sample 106 and may be continuous across fields, the effective stack height z determined at locations of the calibration overlay targets 104 in one field can be used to generate sensitivity metrics for use at locations of the single-cell overlay targets 104 in the same or different fields. In this way, the calibration overlay targets 104 may be distributed with a relatively sparse distribution.

Figure 7:
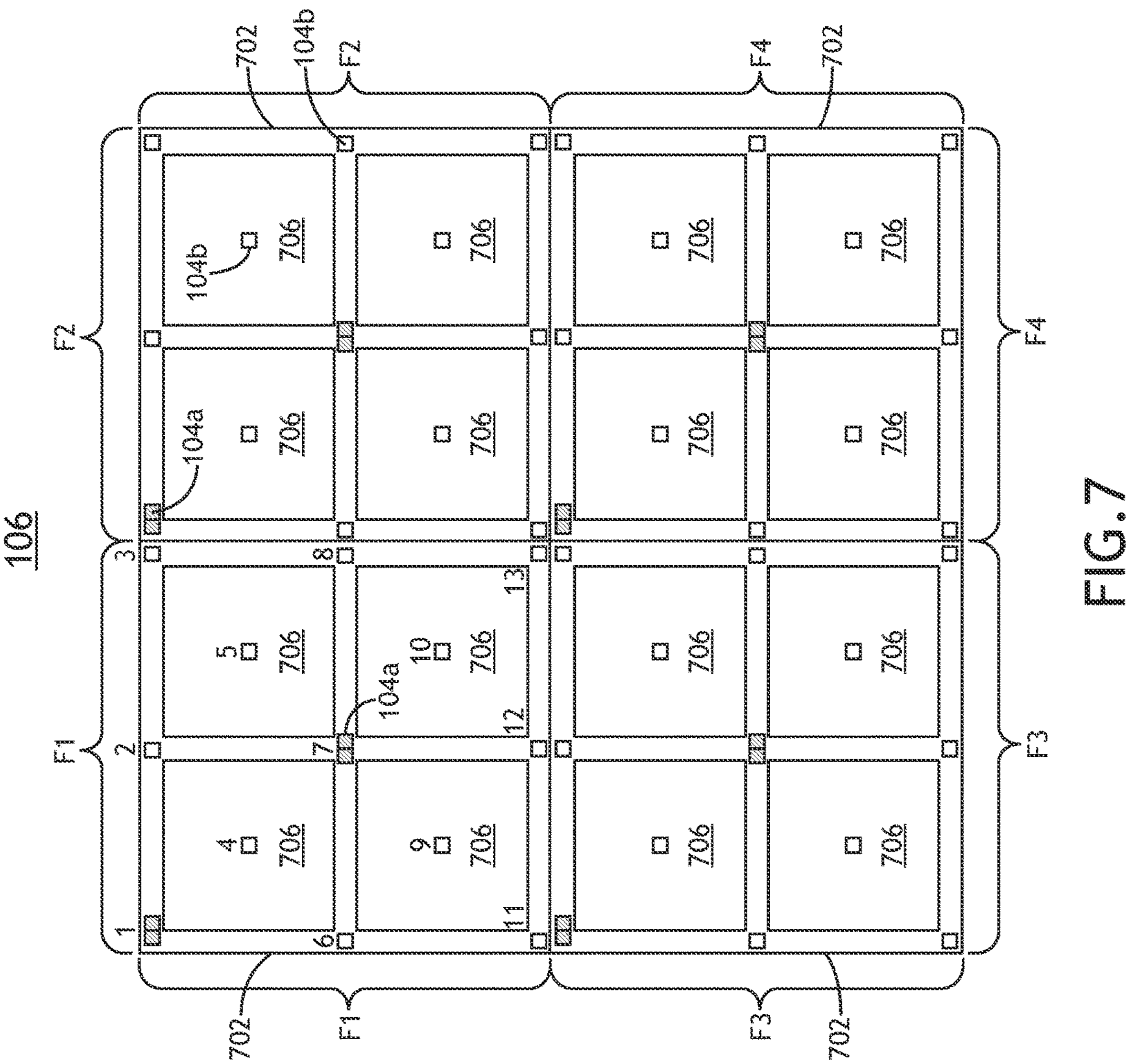
FIG. 7 is a simplified top view of a distribution of calibration and single-cell overlay targets in four fields on a sample, in accordance with one or more embodiments of the present disclosure.

FIG. 7 is a simplified top view of a distribution of calibration and single-cell overlay targets 104 in four fields 702 on a sample 106, in accordance with one or more embodiments of the present disclosure. It is to be understood that the distribution of targets in FIG. 7 is provided solely for illustrative purposes and should not be interpreted as limiting. Rather, any distribution of calibration and single-cell overlay targets 104 is within the sprit and scope of the present disclosure. Further, FIG. 7 is not provided to scale and is merely illustrative.

FIG. 7 depicts four fields 704 labeled F1, F2, F3, and F4, each with four dies 706 and each with the same distribution of overlay targets 104 (labeled 1-13). In the non-limiting distribution of FIG. 7, the calibration targets 104*a* each include two cells 202 (e.g., two grating-over-grating structures) as depicted in FIG. 3A, while the single-cell targets 104*b* each include a single cell 202 (e.g., a single grating-over-grating structure). Each of the fields 704 include two calibration targets 104*a* (labeled 1 and 7 in F1) in scribe lines, where one is in a center of the field 704 and one is located in a corner. Each of the fields 704 also includes 11 single-cell targets 104*b* (labeled 2-6 and 8-13) distributed in both the dies 706 and in the scribe lines (e.g., near corners of the dies 706). In this configuration, the maximum distance between a calibration target 104*a* and a single-cell target 104*b* is the length of one die 706.

It is noted herein that FIG. 7 illustrates a distribution of overlay targets 104 suitable for overlay measurements along one measurement direction (e.g., the horizonal direction in the figure). However, it is to be understood that the concepts disclosed herein may be extended to multi-directional measurements. For example, a calibration overlay target 104 may include two cells 202 per measurement direction with both periodicity and intended offsets of $\pm f_0$ along the respective measurement direction. Similarly, the single-cell overlay targets 104 may include a single cell 202 per direction with periodicity along the respective measurement direction. As another example, calibration overlay targets 104 may include periodicity and intended offsets along two measurement directions (e.g., orthogonal directions). Similarly, single-cell overlay targets 104 may include periodicity along the two measurement directions.

Figure 8:
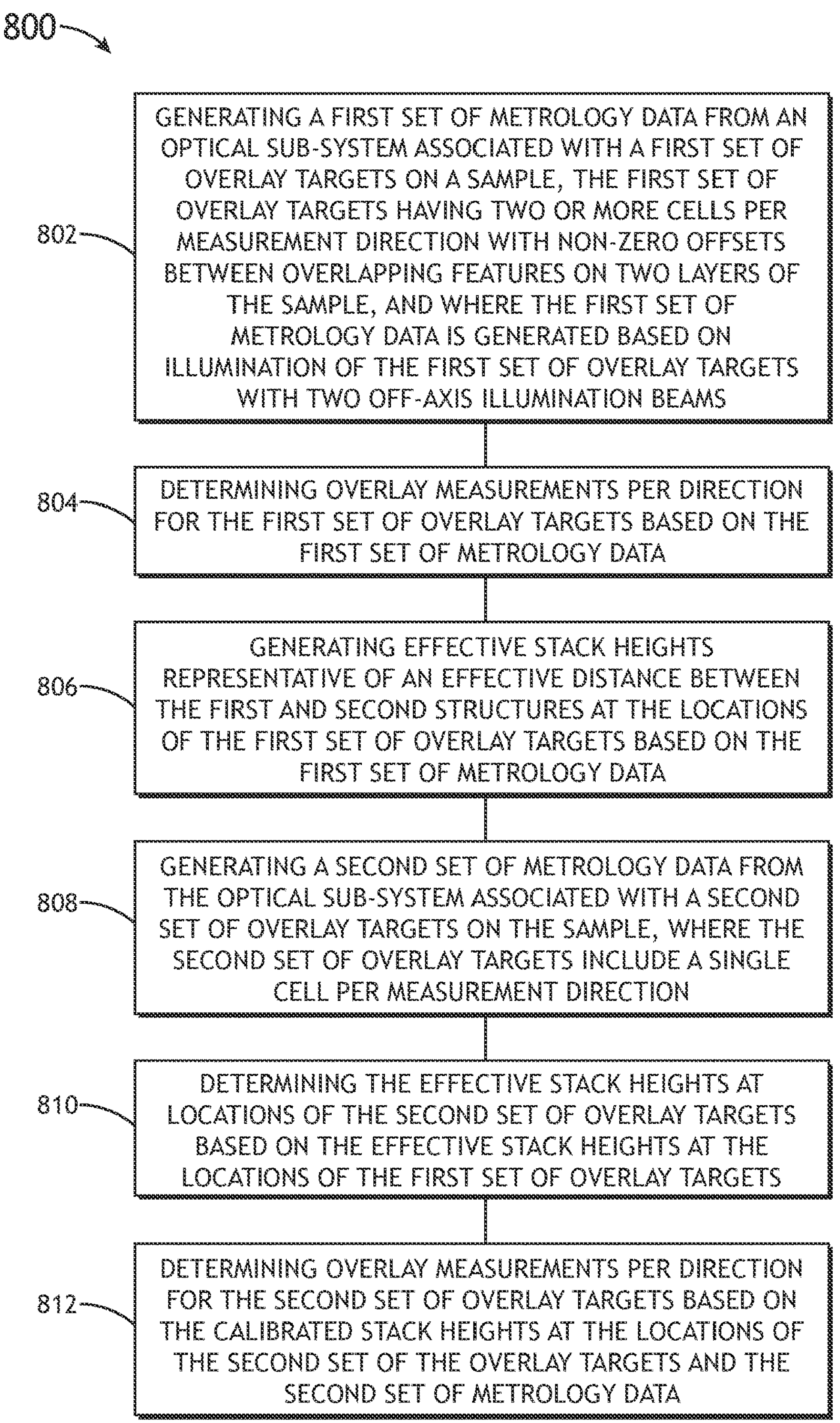
FIG. 8 is a flow diagram illustrating steps performed in a method for efficient scatterometry overlay metrology (SCOL) metrology based on parallax measurements with multiple off-axis illumination beams, in accordance with one or more embodiments of the present disclosure.

Referring now to FIG. 8, FIG. 8 is a flow diagram illustrating steps performed in a method 800 for efficient SCOL metrology based on parallax measurements with multiple off-axis illumination beams 108, in accordance with one or more embodiments of the present disclosure.

Applicant notes that the embodiments and enabling technologies described previously herein in the context of the overlay metrology system 100 should be interpreted to extend to the method 800. It is further noted, however, that the method 800 is not limited to the architecture of the overlay metrology system 100.

In some embodiments, the method 800 includes a step 802 of generating a first set of metrology data from an optical sub-system 102 associated with a first set of overlay targets 104 (e.g., calibration overlay targets 104) on a sample 106, the first set of overlay targets 104 having two or more cells 202 per measurement direction with non-zero offsets (e.g., $\pm f_0$) between overlapping features on two layers of the sample 106, and where the first set of metrology data is generated based on illumination of the first set of overlay targets 104 with two off-axis illumination beams 108.

In some embodiments, the method 800 includes a step 804 of determining overlay measurements per direction for the first set of overlay targets 104 based on the first set of metrology data. Such overlay measurements at the locations of the first set of overlay targets 104 may be generated using any technique known in the art. For example, a first-order SCOL technique may be used to generate metrology data associated with two off-axis illumination beams 108.

In some embodiments, the method 800 includes a step 806 of generating effective stack heights representative of an effective distance between the first and second structures at the locations of the first set of overlay targets 104 based on the first set of metrology data. For example, Equations (29) and (30) relate a difference between overlay measurements associated with the two cells 202 to the known intended offsets of the cells and the effective stack height for the determination of the effective stack height.

In some embodiments, the method 800 includes a step 808 of generating a second set of metrology data from the optical sub-system associated with a second set of overlay targets 104 (e.g., single-cell overlay targets 104) on the sample 106, where the second set of overlay targets 104 include a single cell 202 per measurement direction.

In some embodiments, the method 800 includes a step 810 of determining the effective stack heights z at locations of the second set of overlay targets 104 based on the effective stack heights at the locations of the first set of overlay targets 104. For example, this may include generating a model of the effective stack heights based on the effective stack heights at the locations of the first set of overlay targets 104 and determining the effective stack heights at the locations of the second set of overlay targets 104 based on the model. As an illustration, the effective stack heights at locations of the second set of overlay targets 104 may be calculated based on interpolation, fitting (e.g., polynomial fitting), or nearest neighbor techniques.

In some embodiments, the method 800 includes a step 812 of determining overlay measurements per direction for the second set of overlay targets 104 based on the calibrated stack heights at the locations of the second set of the overlay targets 104 and the second set of metrology data. For example, the parallax techniques disclosed herein may be used to generate overlay measurements on the second set of overlay targets 104 (e.g., the single-cell overlay targets 104) based on the effective stack heights at the associated locations and the metrology data generated based on multiple off-axis illumination beams 108 from step 802.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system, comprising:

a controller configured to be coupled to an optical sub-system for characterizing a sample in accordance with a metrology recipe, wherein the sample in accordance with the metrology recipe includes a plurality of overlay targets, each having one or more cells including overlapping first and second structures on two layers of the sample, wherein the first and second structures in each of the cells is characterized by an offset value $f_0$, wherein the optical sub-system is configured to illuminate the sample with a pair of illumination beams per measurement direction when implementing the metrology recipe, wherein the illumination beams in each pair have a common altitude incidence angle and opposing azimuth incidence angles along the respective measurement direction, wherein the controller includes one or more processors configured to execute program instructions causing the one or more processors to implement the metrology recipe by:

receiving a first set of metrology data from the optical sub-system, wherein the first set of metrology data is associated with two or more cells per measurement direction having nonzero offset values from a first set of the overlay targets;

determining overlay measurements per direction for the first set of the overlay targets based on the first set of metrology data;

generating effective stack heights representative of an effective distance between the first and second structures at locations of the first set of the overlay targets based on the first set of metrology data;

receiving a second set of metrology data from the optical sub-system associated with a single cell per measurement direction from a second set of the overlay targets;

determining the effective stack heights at locations of the second set of the overlay targets based on the effective stack heights at the locations of the first set of the overlay targets; and determining overlay measurements per direction for the second set of the overlay targets based on the effective stack heights at the locations of the second set of the overlay targets and the second set of metrology data.

2. The overlay metrology system of claim 1, wherein the offset value $f_0$ associated with the single cells in the second set of the overlay targets is equal to zero.

3. The overlay metrology system of claim 1, wherein the first set of the overlay targets are located in scribe lines between dies of the sample.

4. The overlay metrology system of claim 1, wherein at least some of the second set of the overlay targets are located in at least some dies on the sample.

5. The overlay metrology system of claim 1, wherein at least some of the second set of the overlay targets are located in scribe lines between dies of the sample.

6. The overlay metrology system of claim 1, wherein determining the overlay measurements per direction for the first set of the overlay targets based on the first set of metrology data comprises:

generating first differential signals associated with positive diffraction orders from each of the two cells per measurement direction;

generating second differential signals associated with negative diffraction orders from each of the two cells per measurement direction;

determining the overlay measurements per direction for the first set of the overlay targets based on the first and second differential signals.

7. The overlay metrology system of claim 6, wherein determining the overlay measurements per direction for the second set of the overlay targets based on the effective stack heights at the locations of the second set of the overlay targets and the second set of metrology data comprises:

generating third differential signals per measurement direction associated with a difference between positive diffraction of light from a first of the illumination beams in an associated pair of illumination beams and negative diffraction of light from a second of the illumination beams in the associated pair;

generating fourth differential signals per measurement direction associated with a difference between positive diffraction of light from the second of the illumination beams in the associated pair and negative diffraction of light from the first of the illumination beams in the associated pair; and determining overlay measurements per direction for the second set of the overlay targets based on the effective stack heights at the locations of the second set of the overlay targets, the third differential signal, and the fourth differential signal.

8. The overlay metrology system of claim 1, wherein a detector for generating the first and second sets of metrology data is located at a pupil plane of the optical sub-system.

9. The overlay metrology system of claim 1, wherein a detector for generating the first and second sets of metrology data is located at a field plane of the optical sub-system.

10. The overlay metrology system of claim 1, wherein a value of the common altitude incidence angle provided by the optical sub-system is adjustable.

11. The overlay metrology system of claim 1, wherein the plurality of overlay targets are configured for two orthogonal measurement directions.

12. The overlay metrology system of claim 1, wherein the plurality of overlay targets are configured for a single measurement directions.

13. The overlay metrology system of claim 1, wherein at least one of the first or the second structures comprise periodic structures.

14. An overlay metrology system, comprising:

an optical sub-system comprising:

one or more optical elements to illuminate a sample with a pair of two illumination beams per measurement direction when implementing a metrology recipe, wherein the illumination beams in each pair of illumination beams have a common altitude incidence angle and opposing azimuth incidence angles along the respective measurement direction, wherein the sample in accordance with the metrology recipe includes a plurality of overlay targets, each having one or more cells including overlapping first and second structures on two layers of the sample, wherein the first and second structures in each of the cells is characterized by an offset value $f_0$;

a detector;

one or more additional optical elements configured to direct at least a portion of light from the sample to the detector;

a controller communicatively coupled to the optical sub-system, the controller including one or more processors configured to execute program instructions causing the one or more processors to implement the metrology recipe by:

receiving a first set of metrology data from the optical sub-system associated with two cells per measurement direction having nonzero offset values of $\pm f_0$ from a first set of the overlay targets;

determining overlay measurements per direction for the first set of the overlay targets based on the first set of metrology data;

generating effective stack heights representative of an effective distance between the first and second structures at locations of the first set of the overlay targets based on the first set of metrology data;

receiving a second set of metrology data from the optical sub-system associated with a single cell per measurement direction from a second set of the overlay targets;

determining the effective stack heights at locations of the second set of the overlay targets based on the effective stack heights at the locations of the first set of the overlay targets; and determining overlay measurements per direction for the second set of the overlay targets based on the effective stack heights.

15. The overlay metrology system of claim 14, wherein the offset value f0 associated with the single cells in the second set of the overlay targets is equal to zero.

16. The overlay metrology system of claim 14, wherein the first set of the overlay targets are located in scribe lines between dies of the sample.

17. The overlay metrology system of claim 14, wherein at least some of the second set of the overlay targets are located in at least some dies on the sample.

18. The overlay metrology system of claim 14, wherein at least some of the second set of the overlay targets are located in scribe lines between dies of the sample.

19. The overlay metrology system of claim 14, wherein determining the overlay measurements per direction for the first set of the overlay targets based on the first set of metrology data comprises:

generating first differential signals associated with positive diffraction orders from each of the two cells per measurement direction;

generating second differential signals associated with negative diffraction orders from each of the two cells per measurement direction;

determining the overlay measurements per direction for the first set of the overlay targets based on the first and second differential signals.

20. The overlay metrology system of claim 19, wherein determining the overlay measurements per direction for the second set of the overlay targets based on the effective stack heights at the locations of the second set of the overlay targets and the second set of metrology data comprises:

generating third differential signals per measurement direction associated with a difference between positive diffraction of light from a first of the illumination beams in an associated pair of illumination beams and negative diffraction of light from a second of the illumination beams in the associated pair;

generating fourth differential signals per measurement direction associated with a difference between positive diffraction of light from the second of the illumination beams in the associated pair and negative diffraction of light from the first of the illumination beams in the associated pair; and determining overlay measurements per direction for the second set of the overlay targets based on the effective stack heights at the locations of the second set of the overlay targets, the third differential signal, and the fourth differential signal.

21. The overlay metrology system of claim 14, wherein the detector is located at a pupil plane of the optical sub-system.

22. The overlay metrology system of claim 14, wherein the detector is located at a field plane of the optical sub-system.

23. The overlay metrology system of claim 14, wherein a value of the common altitude incidence angle provided by the optical sub-system is adjustable.

24. The overlay metrology system of claim 14, wherein the plurality of overlay targets are configured for two orthogonal measurement directions.

25. The overlay metrology system of claim 14, wherein the plurality of overlay targets are configured for a single measurement directions.

26. The overlay metrology system of claim 14, wherein at least one of the first or the second structures comprise periodic structures.

27. An overlay metrology method, comprising:

generating a first set of metrology data with an optical sub-system, wherein the optical sub-system is configured to illuminate a sample with a pair of illumination beams per measurement direction when implementing a metrology recipe, wherein the illumination beams in each pair have a common altitude incidence angle and opposing azimuth incidence angles along the respective measurement direction, wherein the sample in accordance with the metrology recipe includes a plurality of overlay targets, each having one or more cells including overlapping first and second structures on two layers of the sample, wherein the first and second structures in each of the cells is characterized by an offset value $f_0$, wherein the first set of metrology data is associated with two cells per measurement direction having non-zero offset values of $\pm f_0$ from a first set of the overlay targets;

determining overlay measurements per direction for the first set of the overlay targets based on the first set of metrology data;

generating effective stack heights representative of an effective distance between the first and second structures at locations of the first set of the overlay targets based on the first set of metrology data;

generating a second set of metrology data with the optical sub-system associated with a single cell per measurement direction from a second set of the overlay targets;

determining the effective stack heights at locations of the second set of the overlay targets based on the effective stack heights at the locations of the first set of the overlay targets; and determining overlay measurements per direction for the second set of overlay targets based on the effective stack heights at the locations of the second set of the overlay targets and the second set of metrology data.

* * * * *